(12) United States Patent
Hsieh

(10) Patent No.: US 7,710,816 B2
(45) Date of Patent: May 4, 2010

(54) MEMORY ACCESS CIRCUIT

(75) Inventor: Yi-Cheng Hsieh, Taipei County (TW)

(73) Assignee: Via Technologies, Inc., Taipei (TW)

( * ) Notice: Subject to any disclaimer, the term of this patent is extended or adjusted under 35 U.S.C. 154(b) by 135 days.

(21) Appl. No.: 12/049,421

(22) Filed: Mar. 17, 2008

(65) Prior Publication Data

US 2008/0239864 A1 Oct. 2, 2008

(30) Foreign Application Priority Data

Mar. 26, 2007 (TW) .............................. 96110355 A

(51) Int. Cl.
*G11C 8/00* (2006.01)

(52) U.S. Cl. ............. 365/230.08; 365/194; 365/189.05; 365/203; 365/233.5

(58) Field of Classification Search ............ 365/230.08, 365/194, 189.05, 191, 233.1, 233.5, 203
See application file for complete search history.

(56) References Cited

U.S. PATENT DOCUMENTS

| 6,928,007 B2 * | 8/2005 | Jin | 365/194 |
| 6,947,337 B2 * | 9/2005 | Stojanov | 365/189.05 |
| 2004/0243758 A1 * | 12/2004 | Notani | 711/1 |

* cited by examiner

*Primary Examiner*—Anh Phung
*Assistant Examiner*—Toan Le
(74) *Attorney, Agent, or Firm*—Thomas, Kayden, Horstemeyer & Risley

(57) ABSTRACT

A memory access circuit is provided. The memory access circuit includes a latch circuit, a feedback reset circuit, and a gate latch circuit. The latch circuit receives a high level input signal and outputs a first signal. The feedback reset circuit generates a second signal and a reset signal according to the first signal. The gate latch circuit generates a pre-charge signal and an enable signal according to the first signal and the second signal. The memory is accessed according to the pre-charging signal and the enable signal.

15 Claims, 5 Drawing Sheets

MEMORY ACCESS CIRCUIT

BACKGROUND OF THE INVENTION

1. Field of the Invention

The invention relates to memories, and more particularly to memory access circuits.

2. Description of the Related Art

When an external circuit reads data stored in a specific memory cell, a bit line corresponding to the specific memory cell must first be charged to a high level. A word line corresponding to the specific memory cell is then enabled according to an address of the specific memory cell, and data stored in the specific memory cell is then loaded to the bit line. An output circuit then latches onto the data on the bit line and outputs the data to the external circuit. Thus, allowing the external circuit to obtain the data stored in the specific memory cell.

Meanwhile, because bit lines of the memory must be charged in advance (referred to as pre-charging), a pre-charge signal PRE is required to trigger the charge. In addition, because word lines of the memory must be enabled to select specific memory cells from the memory, an enable signal EN is required to trigger the selection. Pre-charging of the bit lines must be earlier than selecting of the word lines to ensure that voltages of the bit lines are raised to a target level before data is output from specific memory cells to the bit lines. FIG. 1 shows an ideal relationship between a pre-charging signal PRE and an enable signal EN. The rising time, T1, of the pre-charging signal T1 must be earlier than the rising time, T2, of the enable signal EN. In addition, the falling time, T3, of the pre-charge signal PRE must be later than the falling time, T4, of the enable signal EN. In other words, the duration D1 should cover the duration D2 to prevent memory access in error.

BRIEF SUMMARY OF THE INVENTION

The invention provides a memory access circuit. The memory access circuit includes circuit receiving a high level input signal and outputting a first signal while a clock signal is triggered; a feedback reset circuit coupled to the latch circuit, the feedback reset circuit generates a second signal according to the first signal; and a gate latch circuit coupled to the latch circuit and a feedback reset circuit, the gate latch circuit generates a pre-charge signal and an enable signal according to the first signal and the second signal.

The invention also provides another memory access circuit. The memory access circuit includes a latch circuit receiving a high level input signal and outputting a first signal while a clock signal is triggered; a delay circuit generating a second signal, a third signal, and a fourth signal according to the first signal; and a gate latch circuit coupled to the latch circuit for generating a pre-charge signal and an enable signal according to the first signal, the second signal, the third signal, and the fourth signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
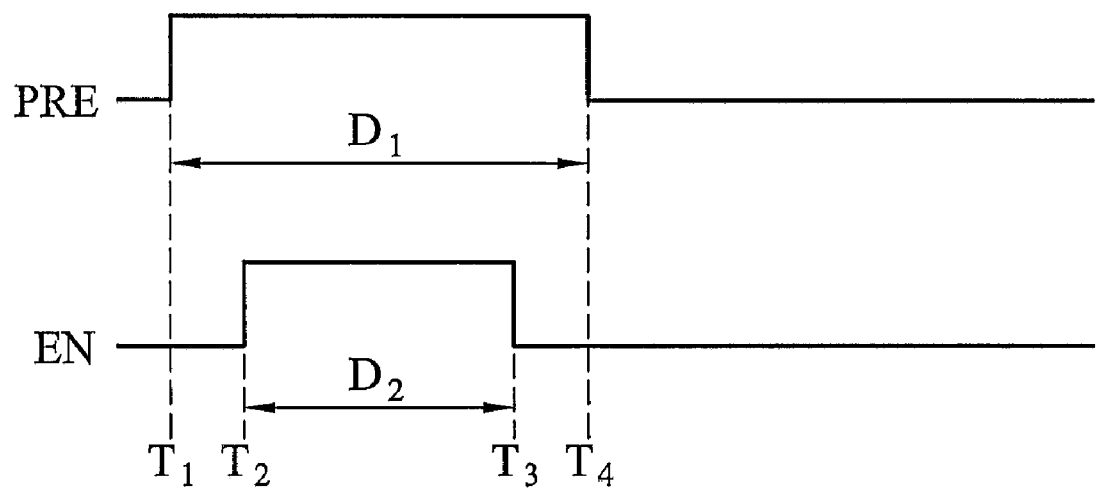
FIG. 1 is a schematic diagram of a pre-charge signal and a conventional access enable signal.
Figure 2:
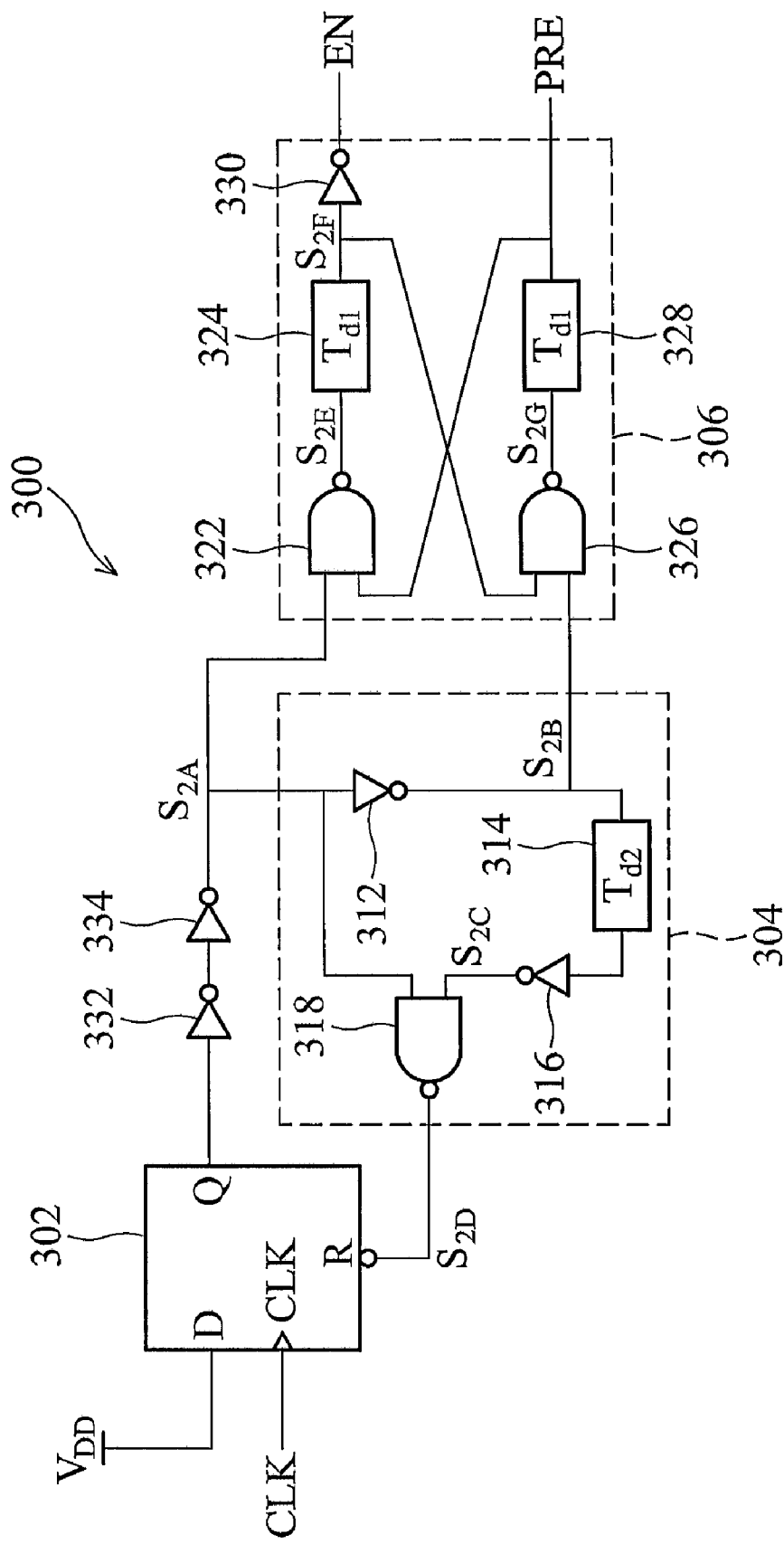
FIG. 2 is a block diagram of a memory access circuit according to the invention.

Referring to FIG. 2, a block diagram of a memory access circuit 300 according to the invention is shown. The memory access circuit 300 includes a latch circuit 302, a feedback reset circuit 304, and a gate latch circuit 306. In this embodiment, the latch circuit 302 is a D-type flip-flop. The latch circuit 302 receives a high level input signal $V_{DD}$. While the clock signal CLK triggers, the latch circuit 302 latches the input signal $V_{DD}$ and outputs a signal $S_{2A}$. The latch circuit 302 also receives a reset signal $S_{2D}$ for resetting the output signal $S_{2A}$ according to the reset signal $S_{2D}$. For example, when the reset signal $S_{2D}$ is asserted (i.e. $S_{2D}$ is at low level), the signal $S_{2A}$ is set to low level.

The feedback reset circuit 304 generates the reset signal $S_{2D}$ according to the signal $S_{2A}$. The feedback reset circuit 304 includes a first inverter 312 for inverting the signal $S_{2A}$ to obtain a signal $S_{2B}$. A delay unit 314 then delays the signal $S_{2B}$ for a delay period $T_{d2}$, and an inverter 318 then inverts output of the delay unit 314 to obtain a signal $S_{2C}$. A NAND gate 318 then performs a NAND operation on the signals $S_{2A}$ and $S_{2C}$ to obtain the reset signal $S_{2D}$. In addition, the output of the latch circuit 302 may be successively inverted by inverters 332 and 334 to obtain the signal $S_{2A}$. The inverters 332 and 334 slightly delay the output of the latch circuit 302 and then deliver the signal $S_{2A}$ to the feedback reset circuit 304.

The gate latch circuit 306 includes NAND gates 322 and 326, delay units 324 and 328, and an inverter 330. The NAND gate 322 performs a NAND operation on the signal $S_{2A}$ and the pre-charge signal PRE to obtain a signal $S_{2E}$. The delay unit 324 delays the signal $S_{2E}$ for a delay period $T_{d1}$ to obtain a signal $S_{2F}$. The inverter 330 then inverts the signal $S_{2F}$ to obtain the enable signal EN. The NAND gate 326 performs a NAND operation on the signals $S_{2B}$ and $S_{2F}$ to obtain a signal $S_{2G}$. The delay unit 328 delays the signal $S_{2G}$ for a delay period $T_{d1}$ to obtain the pre-charge signal PRE. Thus, the gate latch circuit 306 generates the enable signal EN and the pre-charge signal PRE for memory access.

Figure 3:
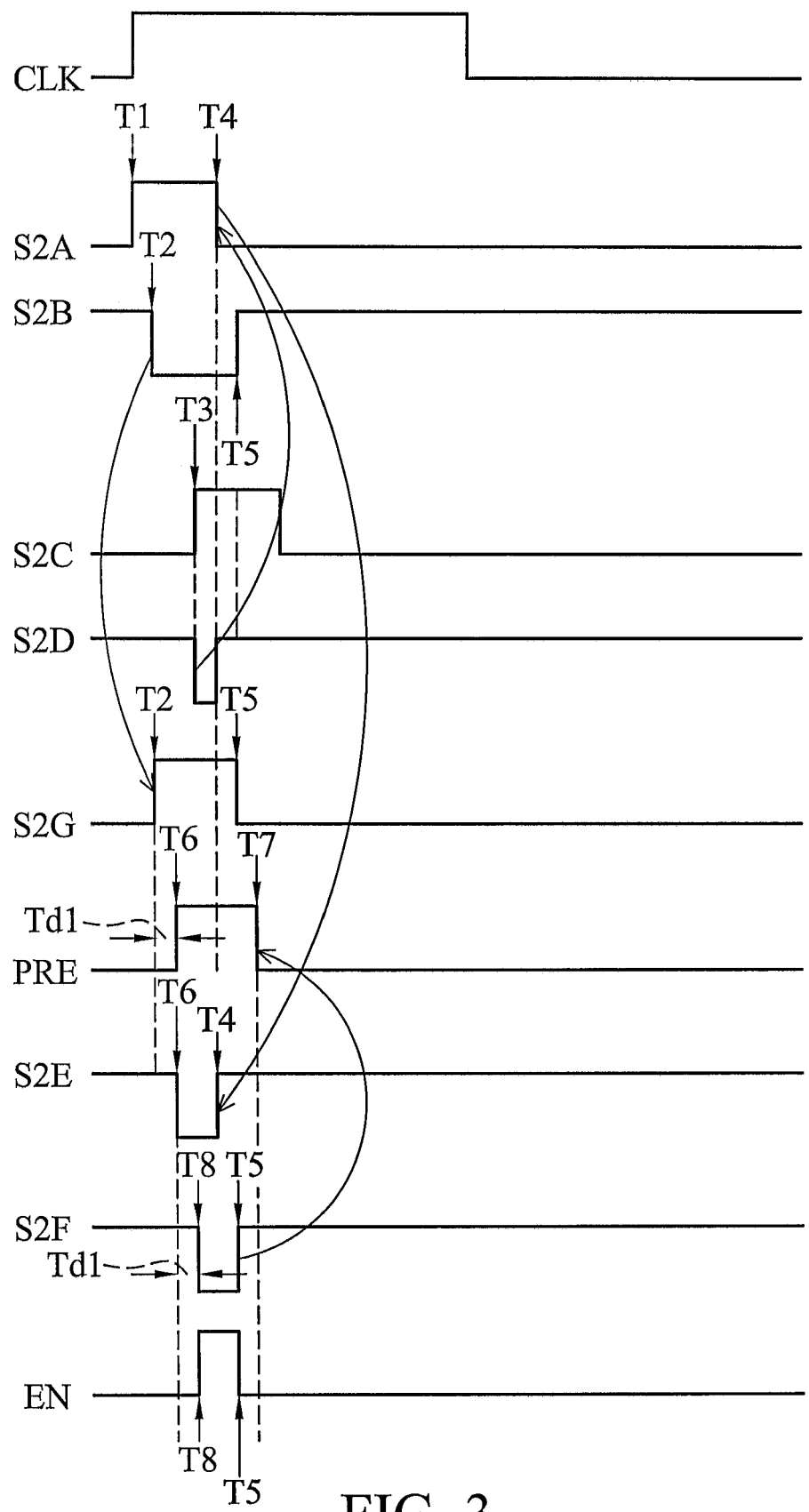
FIG. 3 is a waveform diagram of the memory access circuit of FIG. 2.

Referring to FIG. 3, a waveform diagram of signals for the memory access circuit 300 is shown. Assume the input signal $V_{DD}$ is at high level and ignore the original delay of signal transmission, the waveform diagram is formed as follows. The clock signal CLK rises at time T1; the signal $S_{2A}$ is at high level at time T1. The signal $S_{2A}$ is slightly delayed and then inverted as a signal $S_{2B}$ at time T2. The signal $S_{2B}$ is then delayed for a delay period $T_{d2}$ and then inverted as the signal $S_{2C}$ at time T3, wherein $T3=T2+T_{d2}$. Since the signals $S_{2A}$ and $S_{2C}$ are both at high level at time T3, the reset signal $S_{2D}$ is at low level at time T3 which results in the reset of the signal $S_{2A}$. Assume the signal $S_{2A}$ is reset to low level at time T4. The reset signal $S_{2D}$ is rapidly raised to high level after the reset. The signal $S_{2B}$ is raised to high level at time T5.

Since the signal $S_{2B}$ is at low level during T2 to T5, the signal $S_{2G}$ is at high level during T2 to T5. The pre-charge signal PRE is raised to high level at time T6 (i.e. $T6=T2+T_{d1}$). Since the signal $S_{2A}$ and the pre-charge signal PRE are both at high level at time T6, the signal $S_{2E}$ is therefore at low level at time T6. In addition, because the signal $S_{2A}$ is at low level at time T4, the signal $S_{2E}$ is therefore raised to high level at time T4. Thus, the signal $S_{2E}$ is held at a low level during T6 to T4. The signal $S_{2F}$ is at low level at time T8 ($T8=T6+T_{d1}$) and then raised to a high level at time T5. Since the signal $S_{2B}$ is raised to high level at time T5, the signal $S_{2F}$ is also raised to high level at time T5; as a result, the signal $S_{2G}$ is falling to low level at time T5 and the pre-charge signal is then falling to low level at time T7 ($T7=T5+T_{d1}$).

The enable signal EN is obtained by inverting the signal $S_{2F}$, and since the signal $S_{2F}$ is held at low level during T8 to T5, the enable signal EN is held at high level during T8 to T5. Moreover, the pre-charge signal PRE is held at high level during T6 to T7. Therefore, as shown in FIG. 3, the duration of the enable signal EN is covered by the duration of the pre-charging signal PRE.

Figure 4:
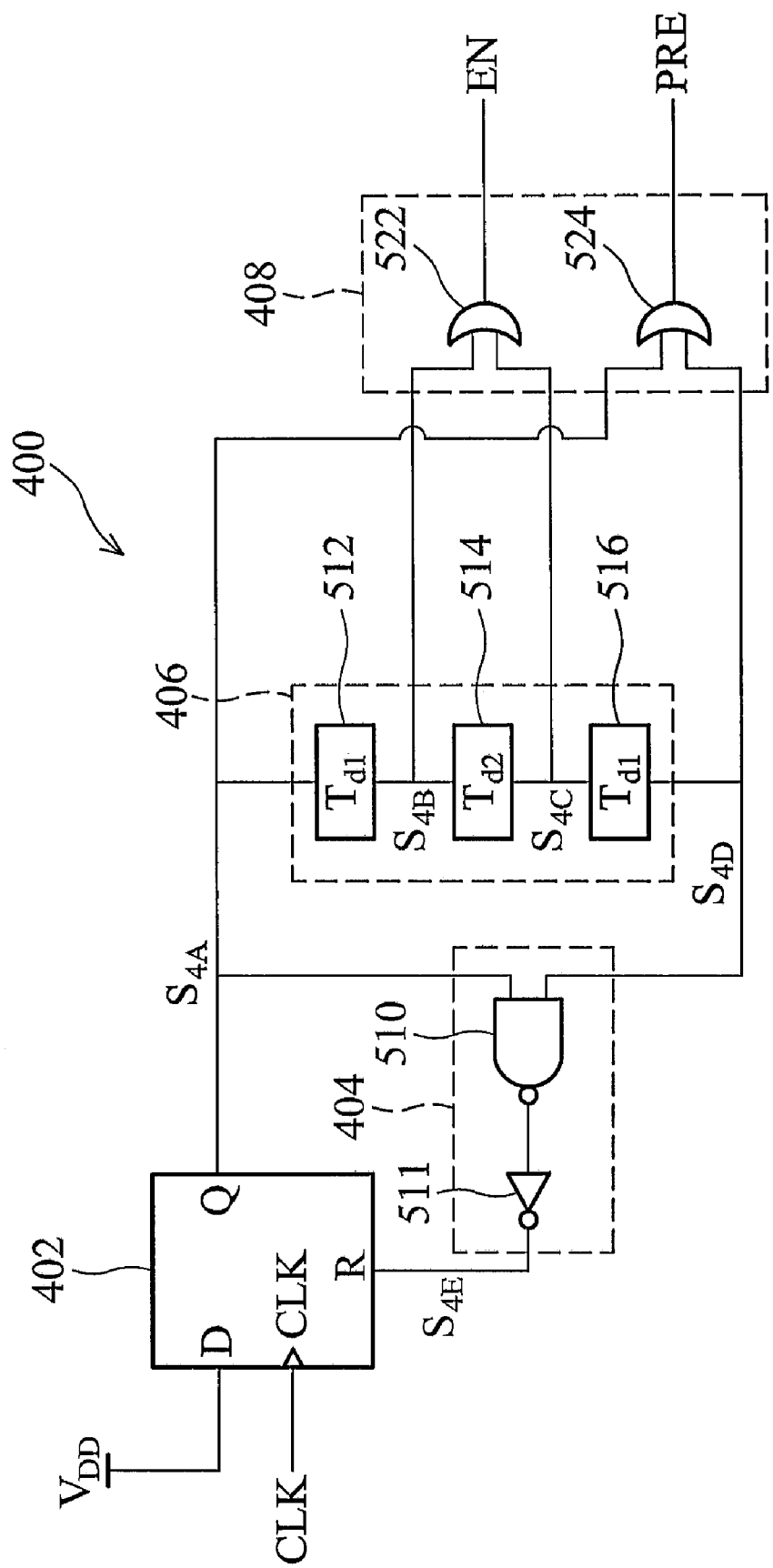
FIG. 4 is a block diagram of another memory access circuit according to the invention.

Referring to FIG. 4, a block diagram of another memory access circuit 400 according to the invention is shown. The memory access circuit 400 includes a latch circuit 402, a feedback reset circuit 404, a delay circuit 406, and a gate latch circuit 408. In this embodiment, the latch circuit 402 is a D-type flip-flop. The latch circuit 402 receives a high level input signal $V_{DD}$. While the clock signal CLK triggers, the latch circuit 402 latches the input signal $V_{DD}$ and outputs a signal $S_{4A}$. Additionally, while a reset signal $S_{4E}$ is high level asserted, the latch circuit 302 resets the signal $S_{4A}$.

The delay circuit 406 includes delay units 512, 514, and 516. The delay unit 512 delays the signal $S_{4A}$ for a delay period $T_{d1}$ to obtain a signal $S_{4B}$; then, the delay unit 514 delays the signal $S_{4B}$ for a delay period $T_{d2}$ to obtain a signal $S_{4C}$; finally, the delay unit 516 delays the signal $S_{4C}$ for a delay period $T_{d1}$ to obtain a signal $S_{4D}$. The reset feedback circuit 404 includes a NAND gate 510 and an inverter 511. The NAND gate 510 performs a NAND operation on the signals $S_{4A}$ and $S_{4D}$, and the inverter 511 then inverts the output of the NAND gate 510 to obtain the reset signal $S_{4E}$. The gate latch circuit 408 includes two OR gates 522 and 524. The OR gate 522 performs an OR operation on the signals $S_{4B}$ and $S_{4C}$ to obtain an enable signal EN. The OR gate 524 performs an OR operation on the signals $S_{4A}$ and $S_{4D}$ to obtain a pre-charge signal PRE.

Figure 5:
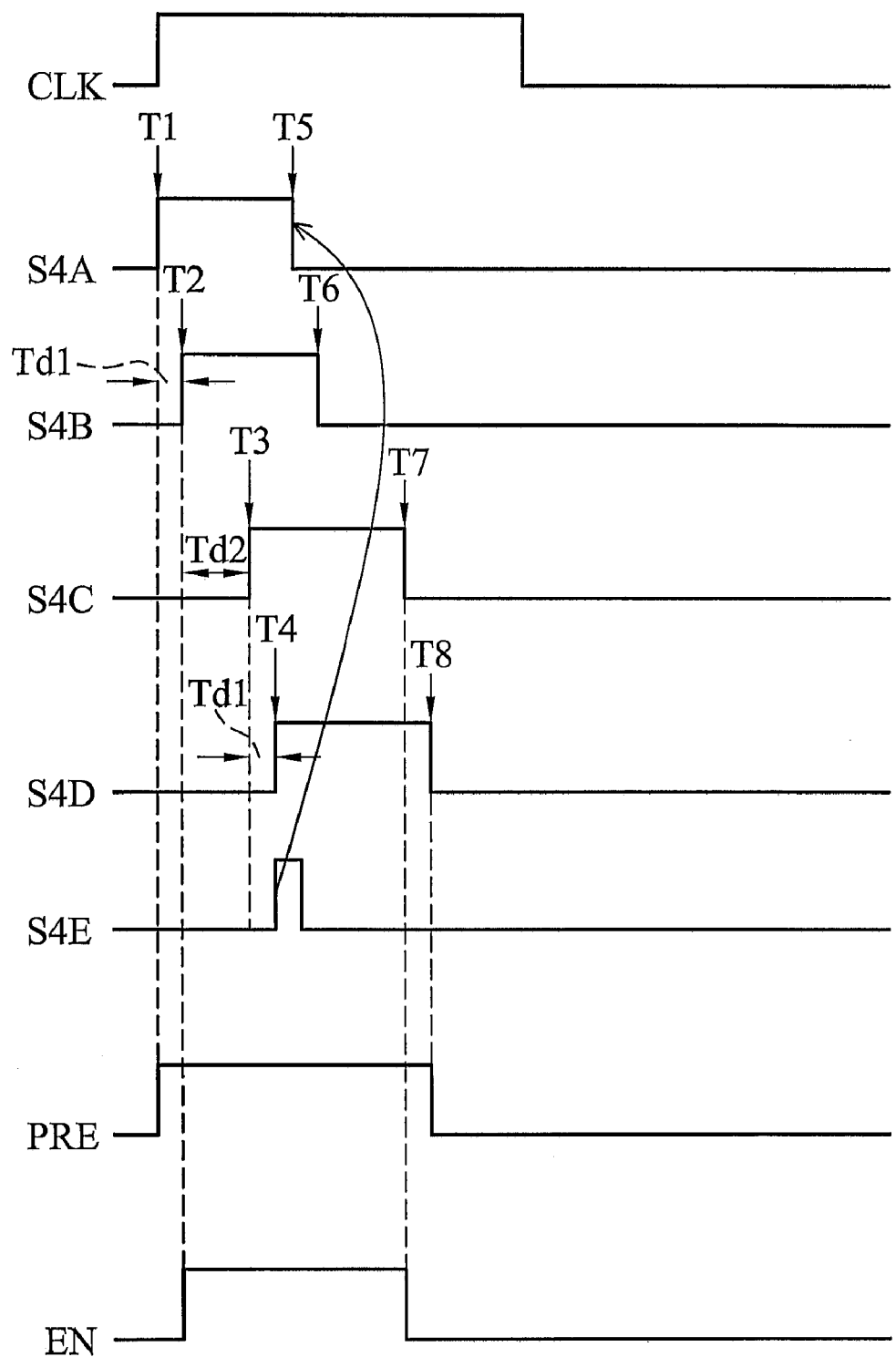
FIG. 5 is a waveform diagram of the memory access circuit of FIG. 4.

Referring to FIG. 5, a waveform diagram the memory access circuit 400 is shown. Assume the input signal $V_{DD}$ is at high level and ignore the original delay of signal transmission, the waveform diagram is formed as follows. The clock signal CLK rises from low level to high level at time T1, and the signal $S_{4A}$ is also at high level at time T1. Since the signals $S_{4B}$, $S_{4C}$, and $S_{4D}$ are obtained by respectively delaying the signal $S_{4A}$ for delay times $T_{d1}$, $(T_{d1}+T_{d2})$, $(2\times T_{d1}+T_{d2})$, the signals $S_{4B}$, $S_{4C}$, and $S_{4D}$ are therefore respectively raised to a high level at time T2 ($T2=T1+T_{d1}$), T3 ($T2=T1+T_{d1}+T_{d2}$), and T4 ($T4=T1+2\times T_{d1}+T_{d2}$). Therefore, the reset signal is raised to a high level at time T4 which results in the reset of the signal $S_{4A}$. Assume the signal $S_{4A}$ is reset to low level at time T5, The reset signal $S_{4E}$ is rapidly raised to high level after the reset. The signal $S_{2B}$ is raised to high level at time T6.

The signal $S_{4A}$ therefore is held at high level during T1 to T5. Accordingly, the signal $S_{4B}$ is held at a high level during T2 to T6, the signal $S_{4C}$ is held at a high level during T3 to T7, and the signal $S_{4D}$ is held at a high level during T4 to T8.

As shown in FIG. 4, the pre-charge signal PRE is obtained by performing an OR operation on the signals $S_{4A}$ and $S_{4D}$; therefore, the pre-charge signal PRE is held at high level during T1 to T8. The duration of T1 to T8 is equal to ($3\times T_{d1}+2\times T_{d2}$). Moreover, the enable signal EN is obtained by performing an OR operation on the signals $S_{4B}$ and $S_{4C}$; as a result; the enable signal EN is raised to high level at time T2 and falling to low level at time T7. The duration of T2 to T7 is equal to ($T_{d1}+2\times T_{d2}$). As shown in FIG. 5, it is observed that the duration of the enable signal EN is covered by the duration of the pre-charging signal PRE.

Although the latch circuits 302 and 402 are triggered by rising edges of the clock signal CLK, the latch circuits 302 and 402 can also be triggered by falling edges of the clock signal CLK or by both rising edges and falling edges of the clock signal CLK in other embodiments.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory access circuit comprising:
   a latch circuit receiving a high level input signal and outputting a first signal while a clock signal is triggered;
   a feedback reset circuit coupled to the latch circuit, the feedback reset circuit generates a second signal according to the first signal; and
   a gate latch circuit coupled to the latch circuit and a feedback reset circuit, the gate latch circuit generates a pre-charge signal and an enable signal according to the first signal and the second signal.

2. The memory access circuit as claimed in claim 1 wherein the feedback reset circuit comprises a first inverter for inverting the first signal to obtain the second signal.

3. The memory access circuit as claimed in claim 2 wherein the feedback reset circuit further comprises:
   a first delay unit coupled to the first inverter;
   a second inverter coupled to the first delay unit; and
   a first NAND gate coupled to the second inverter;
   wherein the first delay unit and the second inverter delays and inverts the second signal to obtain a third signal, and the first NAND gate performs a NAND operation on the first signal and the third signal to obtain the reset signal.

4. The memory access circuit as claimed in claim 3 wherein the first delay unit delays the second signal by a first delay period.

5. The memory access circuit as claimed in claim 1 wherein the memory access circuit further comprises a third inverter and a fourth inverter coupled between the latch circuit and the feedback reset circuit in series for buffering the first signal.

6. The memory access circuit as claimed in claim 1 wherein the gate latch circuit comprises: a second NAND gate, a second delay unit, a fifth inverter, a third NAND gate, and a third delay unit; wherein the second NAND gate performs a NAND operation on the first signal and the pre-charge signal to generate a fourth signal; the second delay unit delays the fourth signal to obtain a fifth signal; the third NAND gate performs a NAND operation on the second signal and the fifth signal to generate a sixth signal; the third delay unit delays the sixth signal to obtain the pre-charge signal; and the fifth inverter inverts the fifth signal to obtain the enable signal.

7. The memory access circuit as claimed in claim 6 wherein the second delay unit and the third delay unit both have a second delay period.

8. The memory access circuit of claim 1 wherein the feedback reset circuit further generates a reset signal for resetting the first signal.

9. The memory access circuit as claimed in claim 8 while the reset signal is low level asserted, the first signal is reset to low level.

10. A memory access circuit comprising:
- a latch circuit receiving a high level input signal and outputting a first signal while a clock signal is triggered;
- a delay circuit generating a second signal, a third signal, and a fourth signal according to the first signal;
- a gate latch circuit coupled to the latch circuit for generating a pre-charge signal and an enable signal according to the first signal, the second signal, the third signal, and the fourth signal; and
- a feedback reset circuit, coupled to the latch circuit and the delay circuit, generating a reset signal according to the first signal and the fourth signal.

11. The memory access circuit as claimed in claim 10 wherein the delay circuit comprises:
- a first delay unit coupled to the latch circuit for delaying the first signal to obtain the second signal;
- a second delay unit coupled to the first delay unit for delaying the second signal to obtain the third signal; and
- a third delay unit coupled to the second delay unit for delaying the third signal to obtain the fourth signal.

12. The memory access circuit as claimed in claim 11 wherein the first delay unit and the third delay unit both have a first delay period, and the second delay unit has a second delay period.

13. The memory access circuit as claimed in claim 10 wherein the feedback reset circuit comprises a NAND gate and an inverter, the NAND gate performs a NAND operation on the first signal and the fourth signal to obtain a fifth signal, and the inverter inverts the fifth signal to obtain the reset signal.

14. The memory access circuit as claimed in claim 10 while the reset signal is high level asserted, the first signal is reset to low level.

15. The memory access circuit as claimed in claim 10 wherein the gate latch circuit comprises:
- a first OR gate coupled to the latch circuit and the delay circuit for performing an OR operation on the first signal and the fourth signal to obtain the pre-charge signal; and
- a second OR gate coupled to the delay circuit for performing an OR operation on the second signal and the third signal to obtain the access enable signal.

* * * * *